United States Patent
Wong et al.

(10) Patent No.: US 7,304,494 B2
(45) Date of Patent: Dec. 4, 2007

(54) METHODS AND APPARATUS TO DC COUPLE LVDS DRIVER TO CML LEVELS

(75) Inventors: Wilson Wong, San Francisco, CA (US); Tim T Hoang, San Jose, CA (US); Sergey Y Shumarayev, San Leandro, CA (US); Rakesh H Patel, Cupertino, CA (US); Simardeep Maangat, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 163 days.

(21) Appl. No.: 11/098,832

(22) Filed: Apr. 4, 2005

(65) Prior Publication Data

US 2006/0220681 A1 Oct. 5, 2006

(51) Int. Cl.
*H03K 17/16* (2006.01)

(52) U.S. Cl. .......................... 326/26; 326/82
(58) Field of Classification Search .................. 326/26, 326/27, 30, 37, 38, 82, 83
See application file for complete search history.

(56) References Cited

U.S. PATENT DOCUMENTS

| | | | |
|---|---|---|---|
| 6,731,135 B2 * | 5/2004 | Brunolli | 326/83 |
| 6,825,693 B2 * | 11/2004 | Schoenborn et al. | 326/86 |
| 6,864,704 B1 * | 3/2005 | Wong et al. | 326/26 |
| 6,972,588 B1 * | 12/2005 | Wong et al. | 326/26 |

OTHER PUBLICATIONS

Goldie, John, "The Many Flavors of LVDS", National Semiconductor, pp. 1-7, printed Nov. 11, 2004.

Goldie, John, "LVDS, CML, ECL-differential interfaces with odd voltages", National Semiconductor, pp. 1-9, printed Nov. 11, 2004.

* cited by examiner

*Primary Examiner*—Daniel Chang
(74) *Attorney, Agent, or Firm*—Ropes & Gray LLP

(57) ABSTRACT

Circuitry and methods are provided for an LVDS-like transmitter that may be able to DC couple to a receiver having a CML termination scheme. Replacing the common mode voltage source of an LVDS transmitter with a resistive pulldown to ground may allow the transmitter to interface in a DC coupled fashion with a CML receiver. Further, the resistive pulldown may be programmable. This LVDS-like transmitter may be able to support a wider customer base by allowing it to DC couple to a wider range of termination voltage levels, such as CML termination voltage levels.

20 Claims, 5 Drawing Sheets

METHODS AND APPARATUS TO DC COUPLE LVDS DRIVER TO CML LEVELS

BACKGROUND OF THE INVENTION

This invention relates to a low-voltage differential signaling (LVDS) buffer design that enables operation at current mode logic (CML) voltage levels.

LVDS and CML are two standards commonly used for differential signal transmission. These standards are especially common in the field of high-speed serial (HSS) interfaces. While each standard has its own advantages and disadvantages, LVDS is generally preferable to CML because it consumes less power due to its lower quiescent DC current. LVDS is also preferable to CML because its implementation has a more standard specification and is less vendor specific.

Ordinarily, it is difficult for an LVDS transceiver to DC couple to a CML transceiver because both of the transceivers would operate at different DC voltage levels. Thus, typically when coupling LVDS and CML transceivers, only AC coupling may be used.

AC coupling decouples or blocks the DC voltage values at the transmitter (TX) and receiver (RX) sides, respectively. AC coupling allows both the transmitter and receiver to operate at DC voltage levels which are optimal. However there is overhead required for AC coupling, such as coupling capacitors for blocking the DC voltage levels, and special signal encoding to prevent drifting of the DC voltage level. Accordingly, DC coupling may be preferable to AC coupling. It would therefore be desirable to design an LVDS transmitter which may be able to DC couple to a CML receiver.

Programmable logic devices ("PLDs") are well known as shown, for example, by such references as Cliff et al. U.S. Pat. No. 5,689,195, Cliff et al. U.S. Pat. No. 5,909,126, Jefferson et al. U.S. Pat. No. 6,215,326, and Ngai et al. U.S. Pat. No. 6,407,576. In general, a PLD is a general-purpose integrated circuit device that is programmable to perform any of a wide range of logic tasks. Rather than designing and building separate logic circuits for performing different logic tasks, general-purpose PLDs can be programmed in various different ways to perform those various logic tasks. Many manufacturers of electronic circuitry and systems find PLDs to be an advantageous way to provide various components of what they need to produce.

Typically, PLDs are designed with LVDS transceivers because of their high-speed, low-power consumption and versatility. While no one type of transceiver is ideally suited for every application, LVDS transceivers are used in PLDs in order to serve a wide customer base with different requirements. In order for the PLDs to serve additional customers that use CML transceivers, it would be highly desirable to provide an LVDS-like transceiver that would also be able to provide DC coupling to a CML transceiver.

SUMMARY OF THE INVENTION

In accordance with this inventions, circuitry and methods are provided for an LVDS-like transmitter that may be able to DC couple to a receiver having a CML termination scheme.

Replacing the common mode voltage source of an LVDS-like transmitter with a resistive pulldown to ground may allow the transmitter to interface in a DC coupled fashion with a CML receiver. Further, the resistive pulldown may be programmable to meet the requirements of the wide customer base that a programmable logic device (PLD) needs to support.

The invention therefore advantageously allows an LVDS-like transmitter to support a wider customer base by allowing it to DC couple to CML termination voltage levels in addition to LVDS termination levels.

BRIEF DESCRIPTION OF THE DRAWINGS

The above and other objects and advantages of the invention will be apparent upon consideration of the following detailed description taken in conjunction with the accompanying drawings, in which like reference characters refer to like parts throughout, and in which.

DETAILED DESCRIPTION OF THE INVENTION

Figure 1:
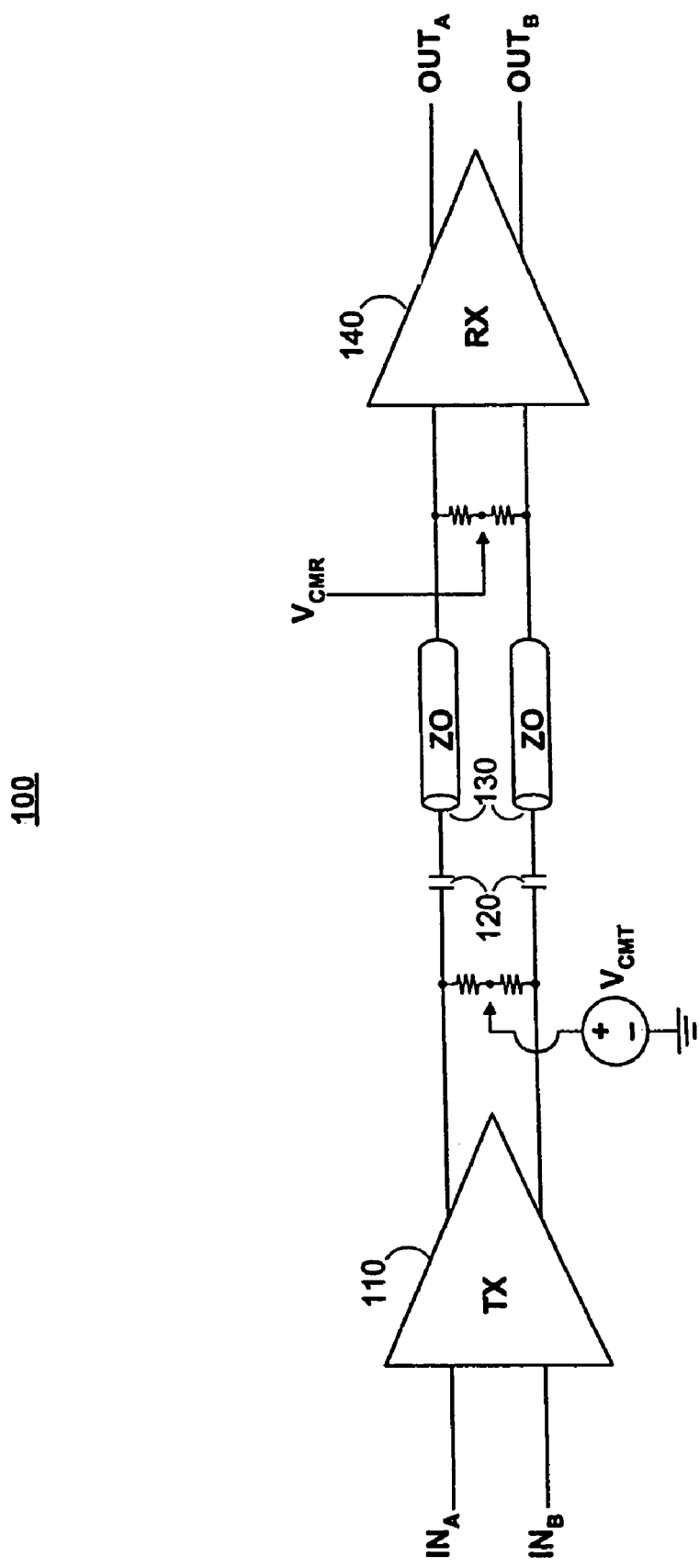
FIG. 1 is a simplified block diagram of a typical AC coupled transmitter to receiver link diagram.

FIG. 1 shows a simplified block diagram 100 of a typical AC coupled transmitter to receiver link. Differential transmitter 110 is connected through two AC coupling capacitors 120 over transmission lines 130 to differential receiver 140. Transmitter 110 may be an LVDS transmitter. An LVDS transmitter may have a common mode voltage VCMT that may be terminated to a voltage level that is approximately half of the supply voltage. Receiver 140 may be a CML receiver. A CML receiver may be terminated to a voltage level that is approximately equal to the supply voltage. In order to connect the LVDS transmitter 110 with the CML receiver 140, coupling capacitors 120 may be used to AC couple the transmitter and receiver allowing each to operate at its own DC level.

LVDS transceivers are preferred over CML transceivers in PLDs because of their lower power consumption, more symmetrical single ended outputs, and better AC coupling support. However, in accordance with the present invention, an LVDS-like transmitter is provided that may meet a wider customer base by additionally allowing it to DC couple to CML termination voltage levels. When AC coupled, the LVDS-like transmitter consumes approximately half the current of a CML transmitter. When DC coupled to a CML termination voltage, the LVDS-like transmitter consumes an amount of current comparable to a CML transmitter. Thus, the LVDS-like transmitter provides comparable or better performances than CML transmitters. Alternatively, a transmitter could be designed to meet both LVDS and CML specifications, but this may be less practical for high-speed operation due to increased overhead and additional loading.

Figure 2:
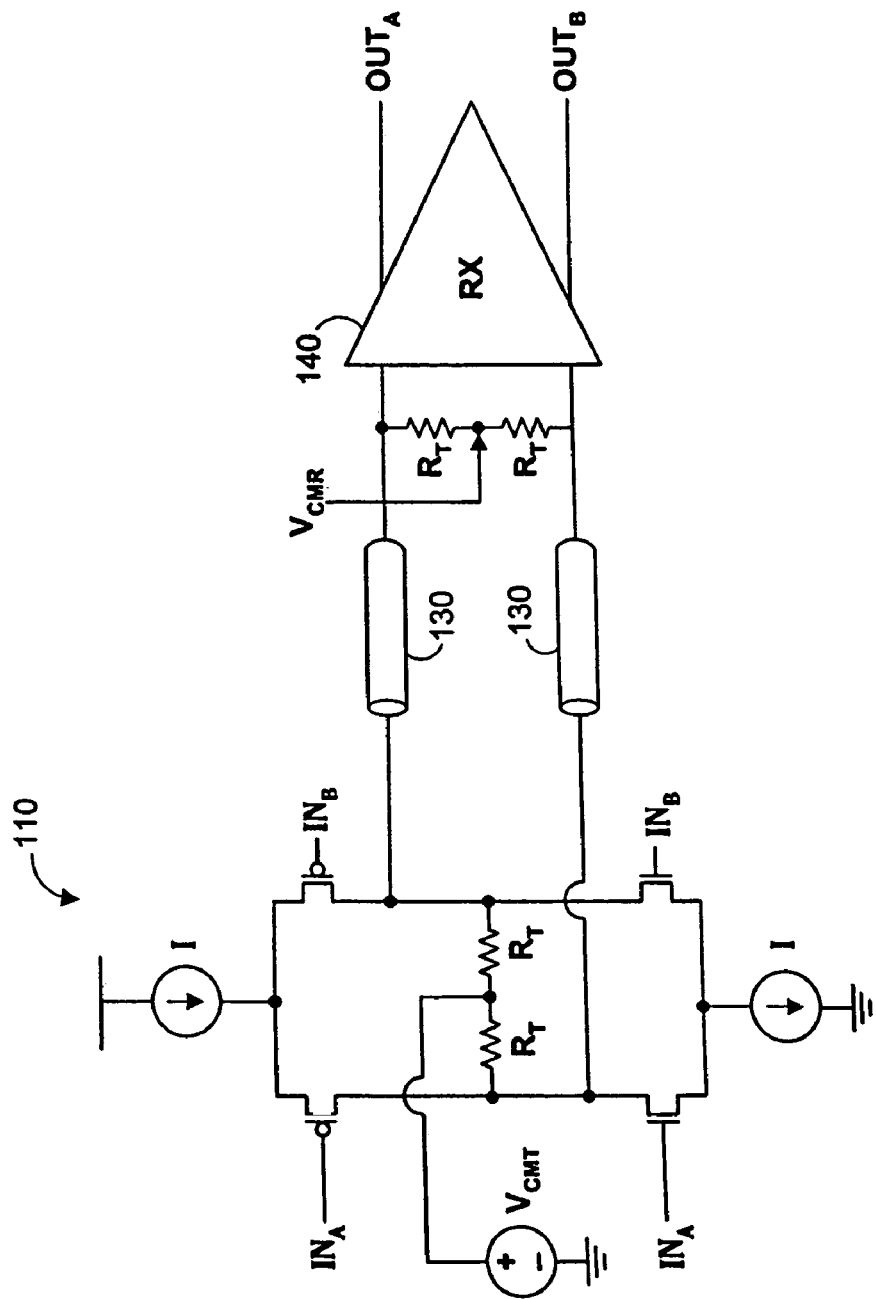
FIG. 2 is a simplified circuit diagram of a typical DC coupled LVDS transmitter and an illustrative receiver.

FIG. 2 shows a simplified circuit diagram 200 of a typical DC coupled LVDS transmitter and an illustrative receiver. As in block diagram 100, circuit diagram 200 shows, in slightly greater detail, LVDS transmitter 110 connected to receiver 140 over transmission lines 130. Circuit diagram 200 does not contain coupling capacitors because transmitter 110 is DC coupled to receiver 140.

Figure 3:
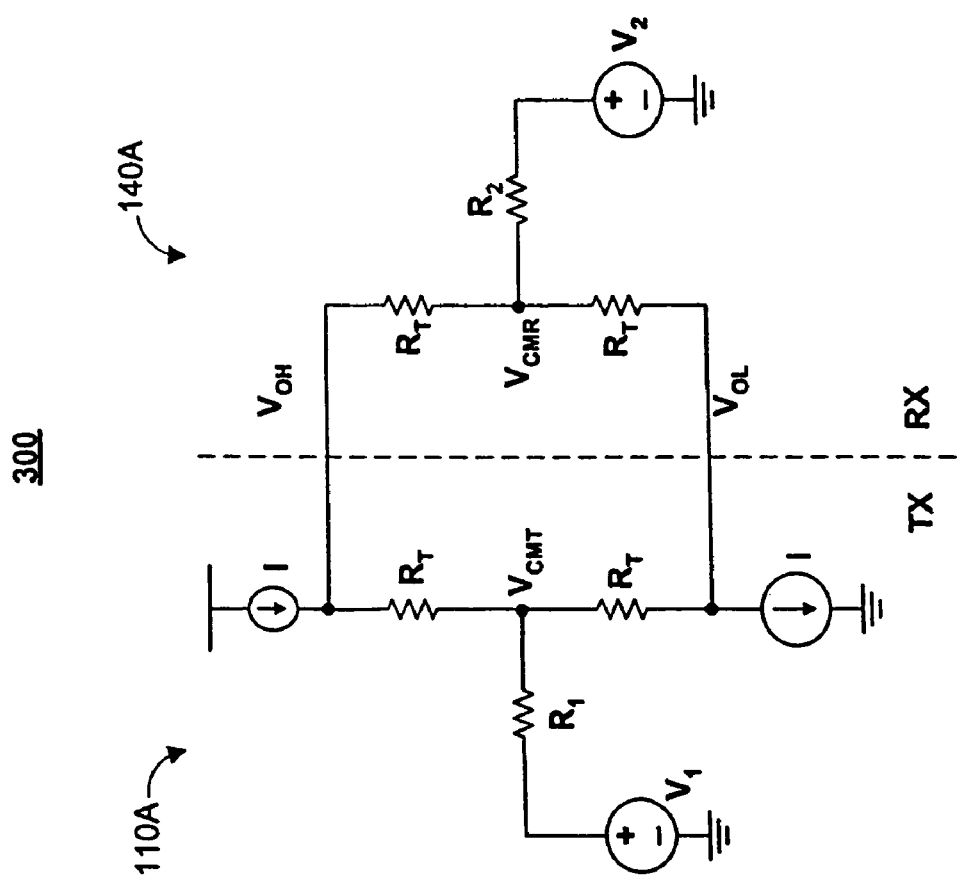
FIG. 3 is a simplified circuit diagram of a generic DC coupled link diagram.

FIG. 3 shows an even more simplified circuit diagram 300 of the DC coupled link shown in circuit diagram 200. In circuit diagram 300 the AC components of the transmitters and the transmission lines have been removed to simplify the diagram and to allow for easier calculations of DC voltage levels.

In diagram 300, $V_{CMT}$ is the common mode voltage of the transmitter 110A and $V_{CMR}$ is the common mode voltage of the receiver 140A. The operation of the transmitter and receiver sides of the DC coupled link, respectively, are affected by the DC levels actually seen by the transmitter and receiver. In this diagram, the output high and low voltages seen by the transmitter and receiver are $V_{OH}$ and $V_{OL}$. Both the transmitter and receiver operate optimally when $V_{OH}$ and $V_{OL}$ fall within a desired range.

A set of equations can be solved to determine the DC voltage levels of the DC coupled link show in circuit diagram 300.

$$V_{CMR} = \frac{R_T \cdot (R_T + R_1) \cdot V_2 + R_T \cdot R_2 \cdot V_1}{(R_T + R_2) \cdot (R_T + R_1) - R_2 \cdot R_1}$$

$$V_{CMT} = R_T \cdot \frac{V_1 + R_1}{R_T + R_1} \cdot V_{CMR}$$

$$V_{OH} = \frac{(V_{CMR} + V_{CMT}) + I \cdot R_T}{2}$$

$$V_{OL} = \frac{(V_{CMR} + V_{CMT}) - I \cdot R_T}{2}$$

Typically, when an LVDS transmitter is DC coupled to a receiver terminated to a CML termination voltage level, $V_{OH}$ and $V_{OL}$ settle to levels that are not ideal for either the transmitter or the receiver. In accordance with the present invention, the LVDS-like transmitter may replace the common mode voltage source with a simple resistive pulldown to ground, which may allow the transmitter and receiver to achieve DC voltage levels $V_{OH}$ and $V_{OL}$ that are more suited to achieving a DC coupled link at CML voltage levels.

For example, referring back to FIG. 2, the equivalent common mode transmitter voltage, $V_1$, may be set to 0V or ground. Then the equations above may be used to solve for an acceptable range of $V_{OH}$ and $V_{OL}$ by adjusting $R_1$. Further, resistor $R_1$ may be programmable to handle different DC termination voltage values and different values of receiver termination resistance $R_2$. Altering the value of $R_1$ may alter DC voltage levels $V_{OH}$ and $V_{OL}$, as well as $V_{OD}$, the differential output voltage swing of the DC coupled link.

A programmable voltage source may also be used to generate values for $V_{CMT}$ in accordance with the present invention. However with this arrangement, a large, accurate voltage source with low impedance would be required. Such an voltage source would occupy a large area and would require a complex design. Thus, a programmable resistor to ground may be preferable for its size and ease of implementation.

Figure 4:
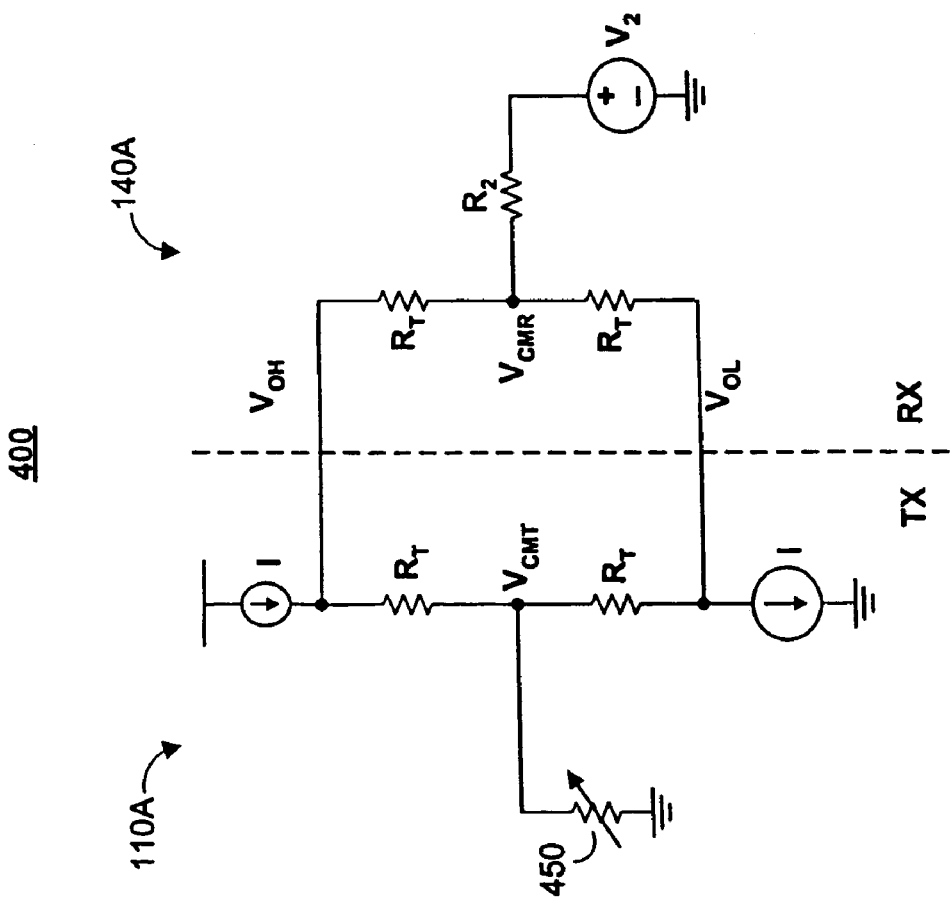
FIG. 4 is a simplified circuit diagram of a generic DC coupled link diagram with an LVDS-like transmitter having a programmable resistive pulldown to ground in accordance with the present invention.

FIG. 4 shows simplified diagram 400 of a DC coupled link having an LVDS-like transmitter in accordance with the present invention. As previously described the common-mode driver of the transmitter may be replaced by a programmable resistor 450. Alternatively, a non-programmable resistor may also be used.

Figure 5:
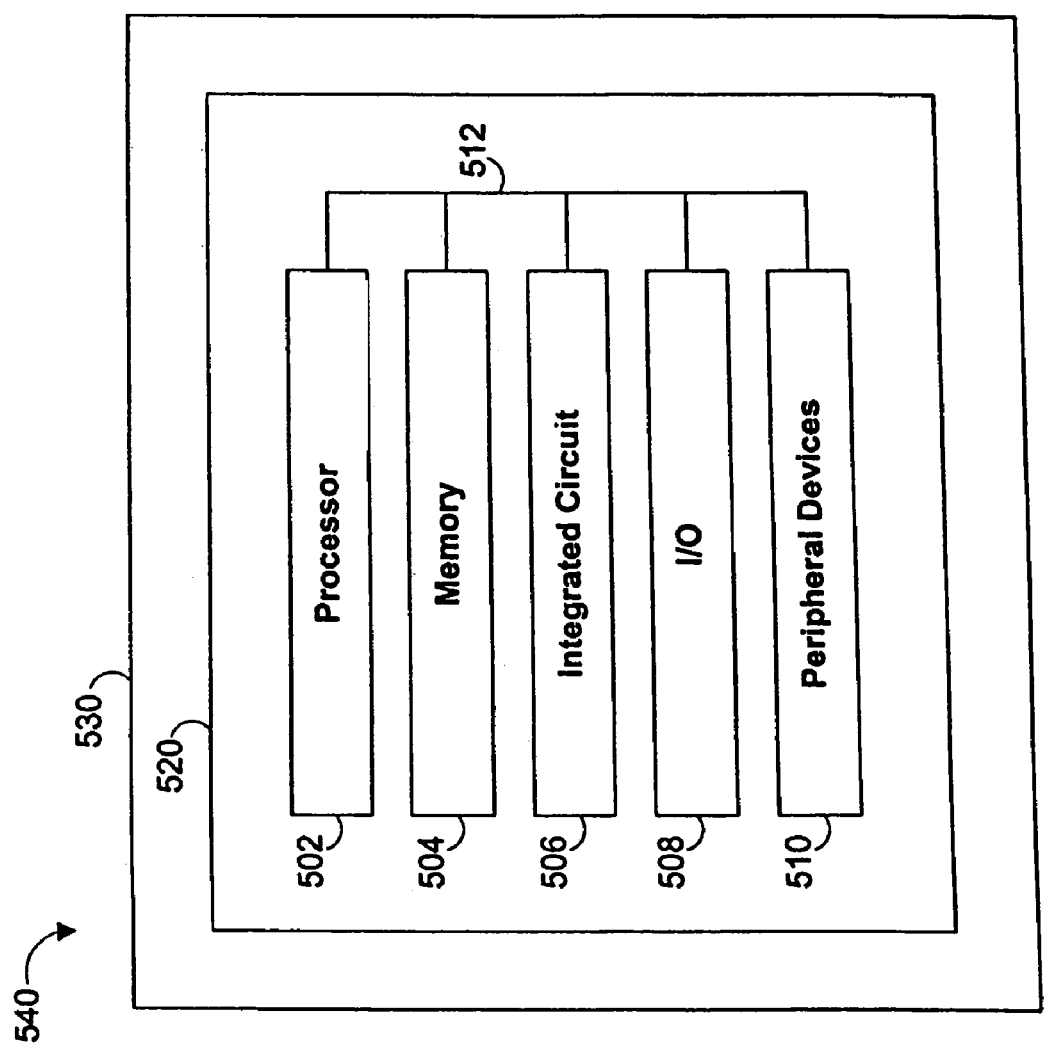
FIG. 5 is a simplified block diagram of an illustrative data processing system incorporating the invention.

FIG. 5 shows an integrated circuit (IC) 506, which incorporates the LVDS-like transmitter of this invention, in a data processing system 540. Data processing system 540 may include one or more of the following components: processor 502; memory 504; I/O circuitry 508; and peripheral devices 510. These components are coupled together by a system bus 512 and are populated on a circuit board 520 which is contained in an end-user system 530.

System 540 can be used in a wide variety of applications, such as computer networking, data networking, instrumentation, video processing, or digital signal processing. IC 506 can be used to perform a variety of different logic functions. For example, IC 506 can be configured as a processor or controller that works in cooperation with processor 502. IC 506 may also be used as an arbiter for arbitrating access to a shared resource in system 540. In yet another example, IC 506 can be configured as an interface between processor 502 and one of the other components in system 540.

Thus it is seen that circuits and methods are provided to DC couple an LVDS driver to CML levels. One skilled in the art will appreciate that the invention can be practiced by other than the described embodiments, which are presented for purposes of illustration and not of limitation, and the present invention is limited only by the claims which follow.

What is claimed is:

1. Transmitter circuitry configured to DC couple to a receiver having a DC termination voltage level and a termination resistance, the transmitter circuitry comprising:
   a transmitter common mode node having a common mode voltage level; and
   a resistor circuit, having a variable resistance, directly connecting the transmitter common mode node and ground.

2. The transmitter circuitry of claim 1 wherein the resistance of the resistor circuitry is varied in response to the DC termination voltage level of the receiver.

3. The transmitter circuitry of claim 1 wherein the resistance of the resistor circuitry is varied in response to the termination resistance of the receiver.

4. The transmitter circuitry of claim 1 wherein varying the resistance of the resistor circuitry varies the common mode voltage level at which the transmitter and receiver are DC coupled.

5. The transmitter circuitry of claim 1 wherein varying the resistance of the resistor circuitry varies a differential output voltage of the transmitter.

6. The transmitter circuitry of claim 1 wherein the resistance of the resistor circuitry is varied automatically.

7. The transmitter circuitry of claim 1 wherein the receiver is a CML receiver.

8. A digital processing system comprising:
   processing circuitry;
   a memory coupled to said processing circuitry; and
   transmitter circuitry as defined in claim 1 coupled to the processing circuitry and the memory.

9. The digital processing system of claim 8 wherein the processing circuitry comprises a PLD.

10. A printed circuit board on which is mounted transmitter circuitry as defined in claim 1.

11. The printed circuit board defined in claim 10 further comprising:
   a memory mounted on the printed circuit board and coupled to the transmitter circuitry.

12. The printed circuit board defined in claim 10 further comprising:
   processing circuitry mounted on the printed circuit board and coupled to the transmitter circuitry.

13. Transmitter circuitry configured to DC couple to a receiver, the transmitter circuitry comprising:

a first transmitter current source coupled between a voltage source and a first termination resistor;

a second transmitter current source coupled between a second termination resistor and ground; and a variable resistor directly coupled between the first and second termination resistors and ground.

14. A method for DC coupling transmitter circuitry to receiver circuitry having a DC termination voltage level and a DC termination resistance, the method comprising varying the resistance of a variable resistor circuit directly connected between a common mode node of the transmitter and ground.

15. The method of claim 14 wherein the resistance of the resistor circuit is varied in response to the DC termination voltage level of the receiver.

16. The method of claim 14 wherein the resistance of the resistor circuit is varied in response to the DC termination resistance of the receiver.

17. The method of claim 14 wherein varying the resistor circuit varies the common mode voltage level at which the transmitter and receiver are DC coupled.

18. The method of claim 14 wherein varying the resistor circuit varies a differential output voltage of the transmitter.

19. The method of claim 14 wherein the resistance of the resistor circuit is varied automatically.

20. The method of claim 14 wherein the receiver is a CML receiver.

* * * * *